Figure 1:
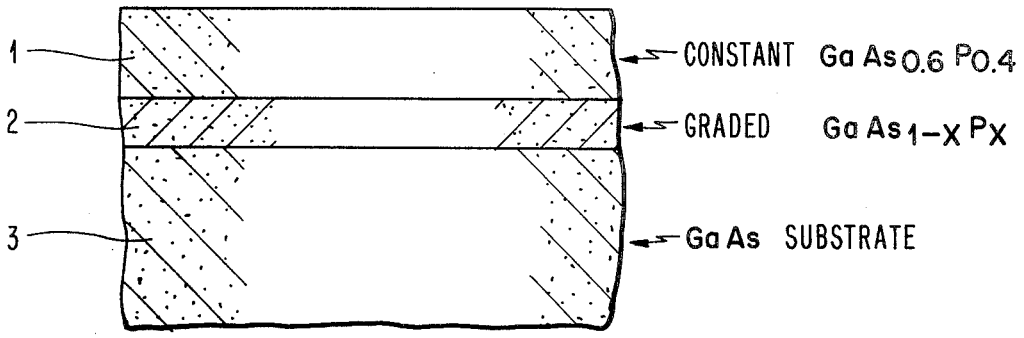
Figure 2A:
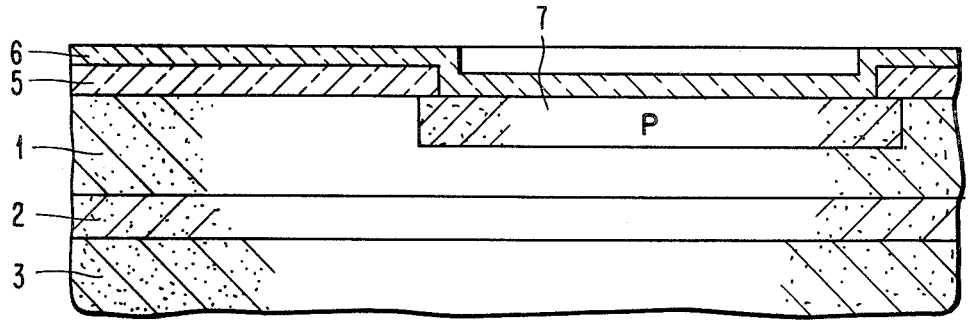
Figure 2B:
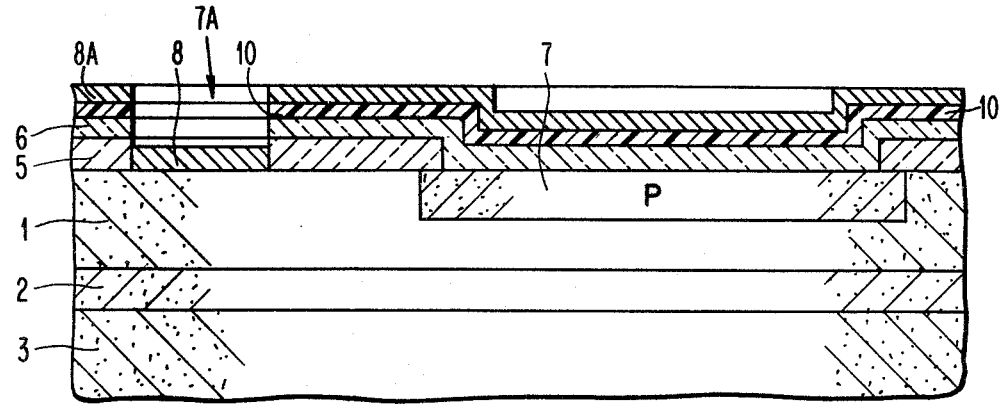
Figure 2C:
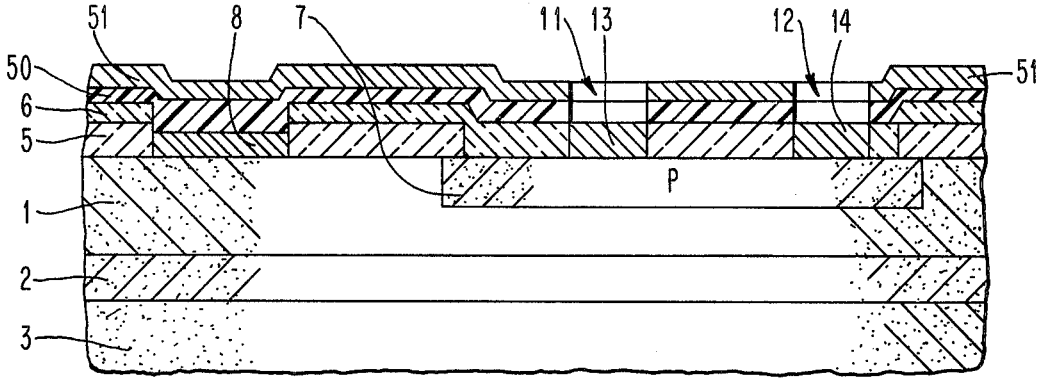
Figure 2D:
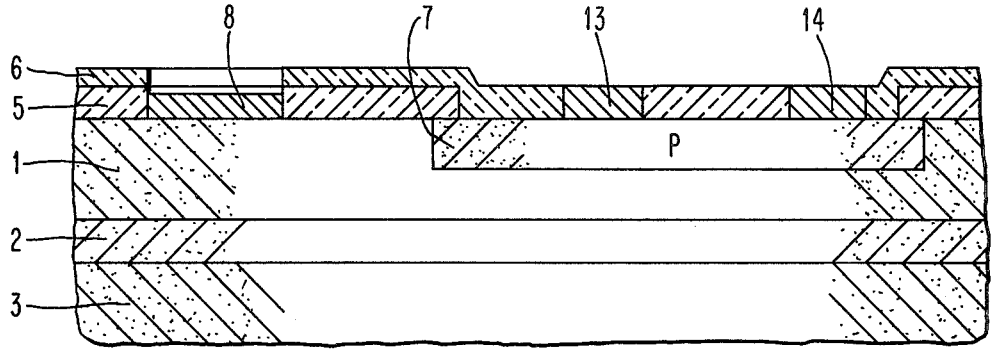
Figure 2E:
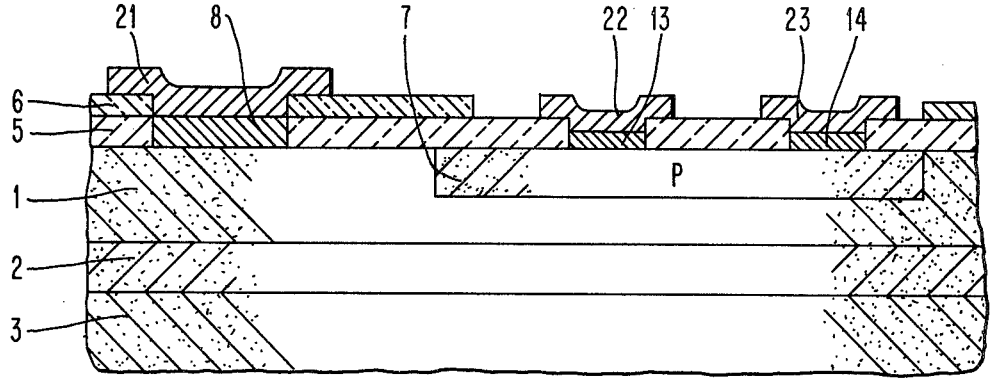
Figure 3A:
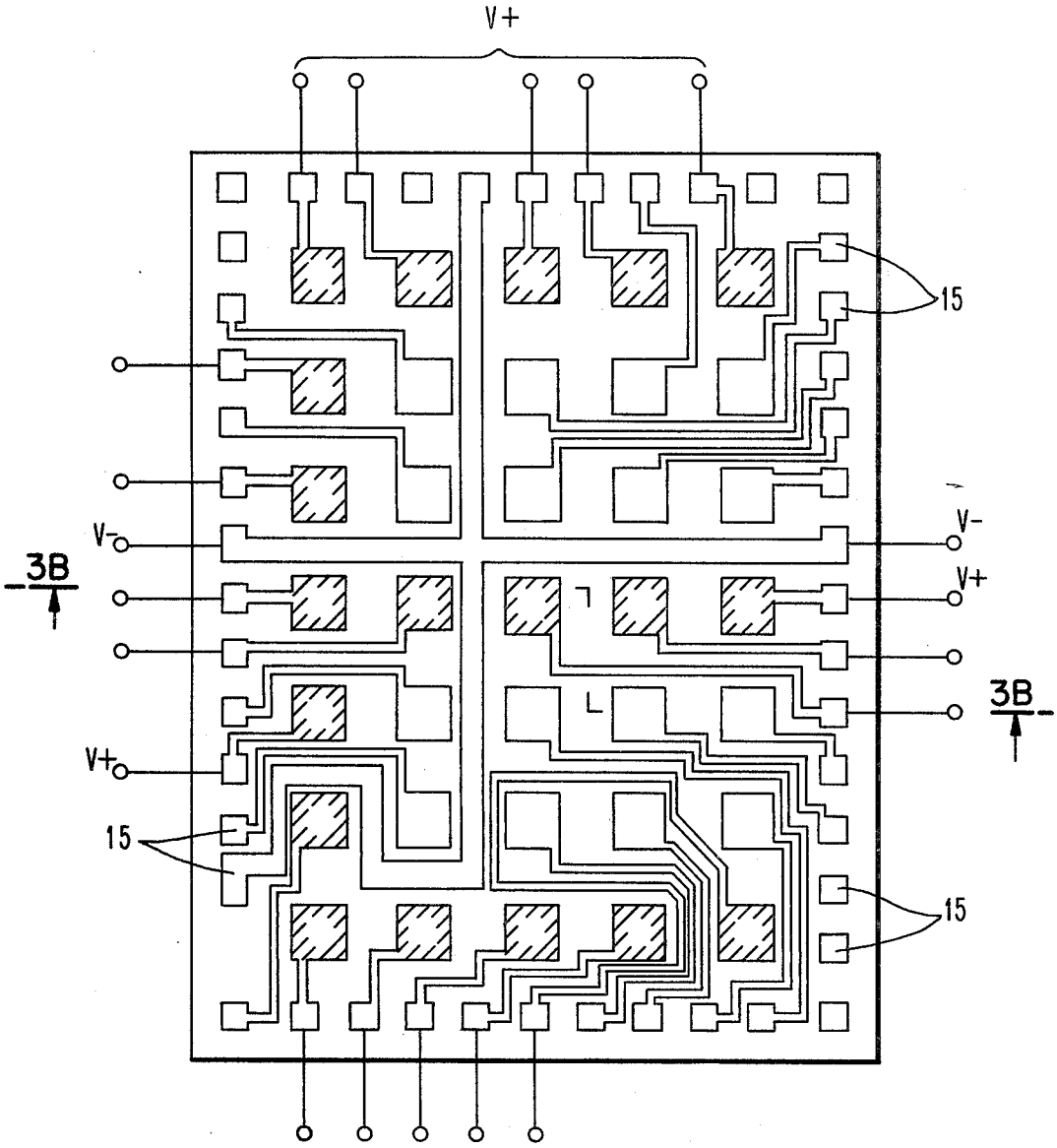
Figure 3B:
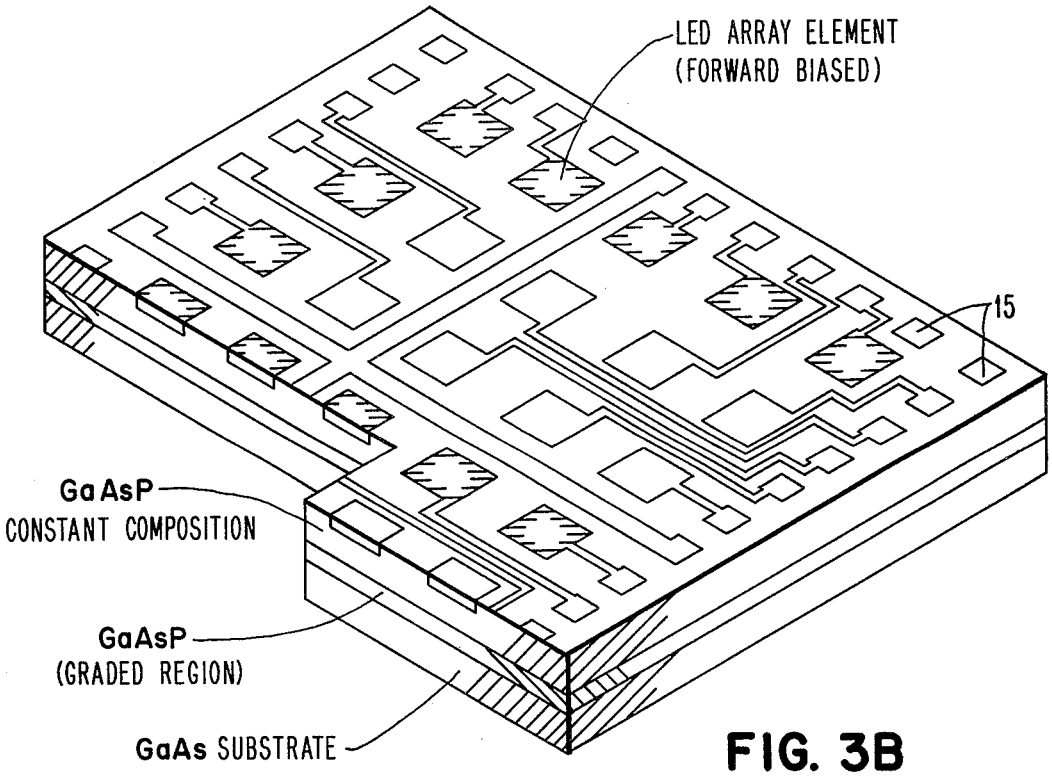
Figure 4:
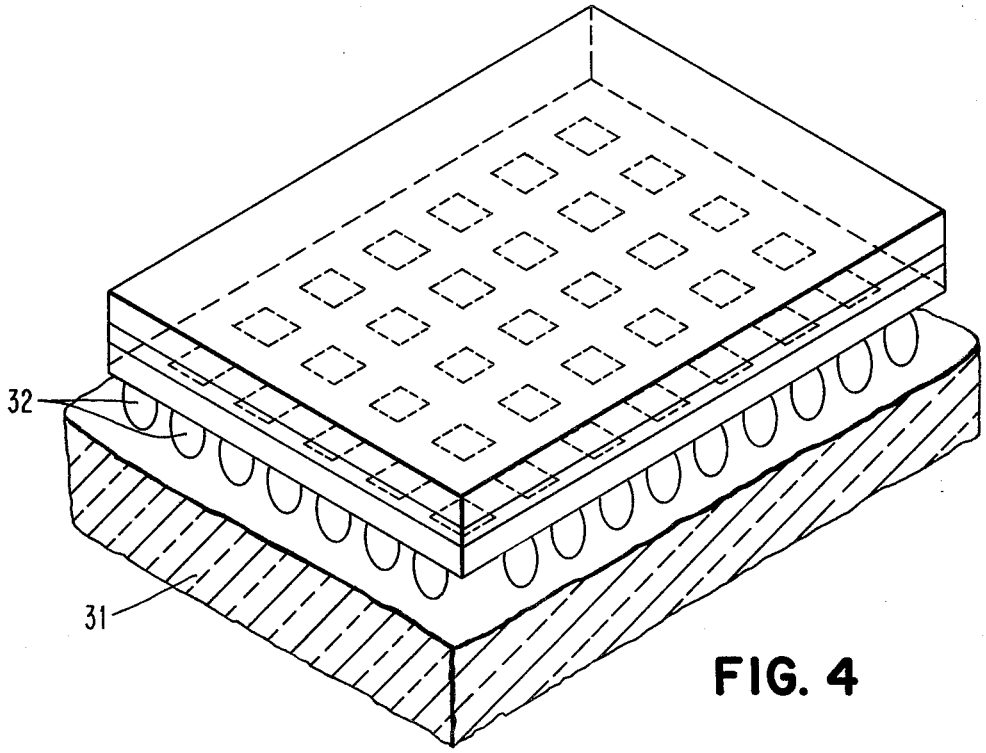
Figure 5A:
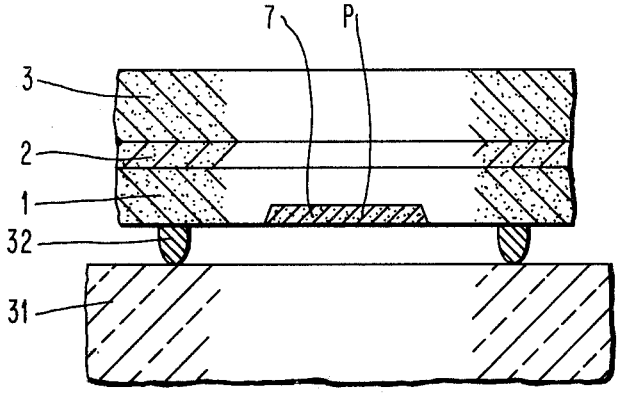
Figure 5B:
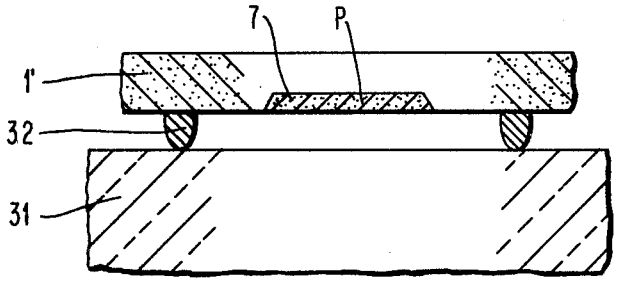
Figure 5C:
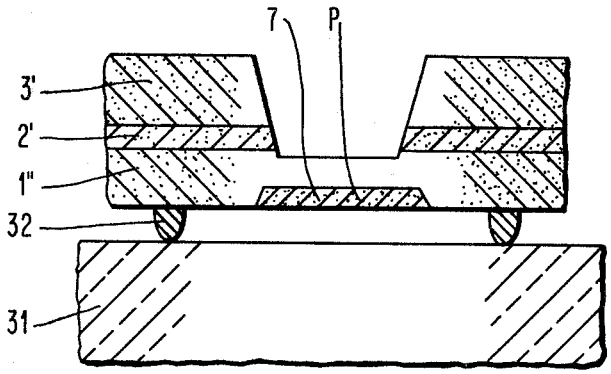

United States Defensive Publication [19] (H) [11] T979,005

Edmonds [43] Feb. 6, 1979

[54] LIGHT EMITTING DIODES WITH BACK-SIDE EMISSION

[75] Inventor: Harold D. Edmonds, Hopewell Junction, N.Y.

[73] Assignee: International Business Machines Corporation, Armonk, N.Y.

[21] Appl. No.: 788,179

[22] Filed: Apr. 18, 1977

Related U.S. Application Data

[63] Continuation of Ser. No. 476,812, Jun. 6, 1974, abandoned.

[51] Int. Cl.[2] ..... H01L 33/00

[52] U.S. Cl. ..... 357/17; 357/55

[57] ABSTRACT

A back-side light-emitting diode comprised of an N-type free-standing monocrystalline planar substrate of a III-V ternary compound in which a P-type impurity is diffused into one of the planar surfaces, of the substrate, with the distance x in microns from the junction depth to the other planar surface conforming to the relationship $x = 0.5/\alpha$, where $\alpha$ is the absorption coefficient of said compound at a 7,000 Angstrom wavelength.

4 Claims, 5 Sheets Drawing,

22 Pages Specification

The file of this unexamined application may be inspected and copies thereof may be purchased (849 O.G. 1221, Apr. 9, 1968).

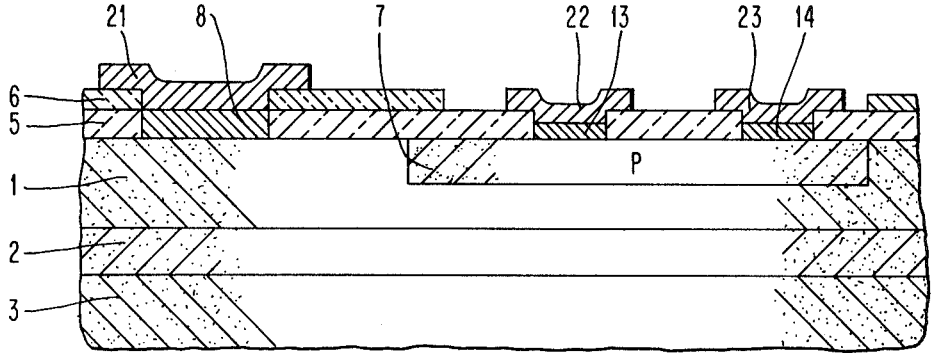

NO REMOVAL

COMPLETE REMOVAL

SELECTIVE REMOVAL